United States Patent
Fukui et al.

(10) Patent No.: US 11,486,550 B2
(45) Date of Patent: Nov. 1, 2022

(54) METHOD FOR PRODUCING WAVELENGTH CONVERSION SINTERED BODY

(71) Applicant: NICHIA CORPORATION, Anan (JP)

(72) Inventors: Tomoya Fukui, Tokushima (JP); Tadayoshi Yanagihara, Tokushima (JP)

(73) Assignee: NICHIA CORPORATION, Anan (JP)

( * ) Notice: Subject to any disclaimer, the term of this patent is extended or adjusted under 35 U.S.C. 154(b) by 237 days.

(21) Appl. No.: 16/881,174

(22) Filed: May 22, 2020

(65) Prior Publication Data

US 2020/0370715 A1 Nov. 26, 2020

(30) Foreign Application Priority Data

May 22, 2019 (JP) .............................. JP2019-096101
May 7, 2020 (JP) .............................. JP2020-081914

(51) Int. Cl.
*H01S 5/06* (2006.01)
*F21K 9/90* (2016.01)
*F21K 9/64* (2016.01)
*H01L 33/00* (2010.01)

(52) U.S. Cl.
CPC ............ *F21K 9/90* (2013.01); *F21K 9/64* (2016.08); *H01L 33/0062* (2013.01); *H01S 5/0611* (2013.01); *H01L 2933/0041* (2013.01)

(58) Field of Classification Search
CPC .............. C04B 35/597; C09K 11/7774; C09K 11/7734

See application file for complete search history.

(56) References Cited

U.S. PATENT DOCUMENTS

| | | | |
|---|---|---|---|
| 11,362,240 B2* | 6/2022 | Lim | A61L 2/26 |
| 2008/0220260 A1* | 9/2008 | Schmidt | C04B 35/6455 264/683 |
| 2010/0164367 A1* | 7/2010 | Shioi | C04B 35/62685 313/503 |
| 2017/0073578 A1* | 3/2017 | Takahashi | C04B 35/62625 |
| 2019/0031567 A1* | 1/2019 | Yu | C04B 35/597 |
| 2021/0312621 A1* | 10/2021 | Chou | G01N 21/274 |

FOREIGN PATENT DOCUMENTS

| | | |
|---|---|---|
| JP | H01197357 A | 8/1989 |
| JP | H035362 A | 1/1991 |
| JP | H06172034 A | 6/1994 |
| JP | H07165462 A | 6/1995 |
| JP | 2009012985 A | 1/2009 |
| JP | 2010007732 A | 1/2010 |
| JP | 2014234487 A | 12/2014 |
| JP | 2016180076 A | 10/2016 |
| WO | 2015133612 A1 | 9/2015 |

\* cited by examiner

*Primary Examiner* — Andrew J Coughlin
(74) *Attorney, Agent, or Firm* — Hunton Andrews Kurth LLP

(57) ABSTRACT

Provided is a method for producing a wavelength conversion sintered body that emits light under irradiation of excitation light. The method for producing a wavelength conversion sintered body includes: preparing a molded body obtained by molding a mixture containing an α-SiAlON fluorescent material and aluminum oxide particles and having a content of Ga of 15 ppm by mass or less; and primary calcining the molded body at a temperature in a range of 1,370° C. or more and 1,600° C. or less to obtain a first sintered body.

20 Claims, 3 Drawing Sheets

METHOD FOR PRODUCING WAVELENGTH CONVERSION SINTERED BODY

CROSS-REFERENCE TO RELATED PATENT APPLICATION

This application claims priority to Japanese Patent Application No. 2019-096101, filed on May 22, 2019, and Japanese Patent Application No. 2020-081914 filed on May 7, 2020, the entire disclosures of which are hereby incorporated reference in their entireties.

BACKGROUND

Technical Field

The present disclosure relates to a method for producing a wavelength conversion sintered body.

Description of Related Art

A light emitting device using a light emitting element such as a light emitting diode (hereinafter also referred to as "LED") or a laser diode (hereinafter also referred to as "LD") comprises a light emitting element serving as a light source and a wavelength conversion member that absorbs a portion of light emitted from the light emitting element and converts the wavelength of the light to a different wavelength. Such a light emitting device is being utilized in a wide variety of fields including a light emitting device for automobile use or indoor lighting use, a backlight source for a liquid crystal display device, an illumination, a light source device for a projector, and the like.

As a fluorescent material used in such a light emitting device, a fluorescent material such as a rare earth aluminate fluorescent material or an α-SiAlON fluorescent material contained in a wavelength conversion member disclosed in International Unexamined Patent Publication No. 2015/133612 is known. Also, as a wavelength conversion member containing a fluorescent material, for example, Japanese Unexamined Patent Publication No. 2014-234487 discloses a wavelength conversion member composed of a sintered body obtained by mixing glass and a fluorescent material, and melting and solidifying the glass. In this specification, the "fluorescent material" is used in the same meaning as a "fluorescent phosphor".

However, when the wavelength conversion member disclosed in each of International Unexamined Patent Publication No. 2015/133612 and Japanese Unexamined Patent Publication No. 2014-234487 constitutes a light emitting device, the heat radiation from the fluorescent material may be insufficient. Further, in the wavelength conversion member disclosed in Japanese Unexamined Patent Publication No. 2014-234487, the glass component acts on the component of the fluorescent material at the time of forming the sintered body, and may adversely affect the light emission of the fluorescent material. Under these circumstances, there is a concern that the light emission intensity of the wavelength conversion member may be lowered.

Accordingly, the present disclosure has an object to provide a method for producing a wavelength conversion sintered body capable of providing a desired light emission intensity.

SUMMARY

An embodiment of the present disclosure relates to a method for producing a wavelength conversion sintered body including: preparing a molded body comprising or composed of a mixture comprising an α-SiAlON fluorescent material and aluminum oxide particles and having a content of Ga of 15 ppm by mass or less; and primary calcining the molded body at a temperature in a range of 1,370° C. or more and 1,600° C. or less to obtain a first sintered body.

In accordance with the present disclosure, a method for producing a wavelength conversion sintered body capable of providing a desired light emission intensity can be provided.

DETAILED DESCRIPTION

Figure 1:
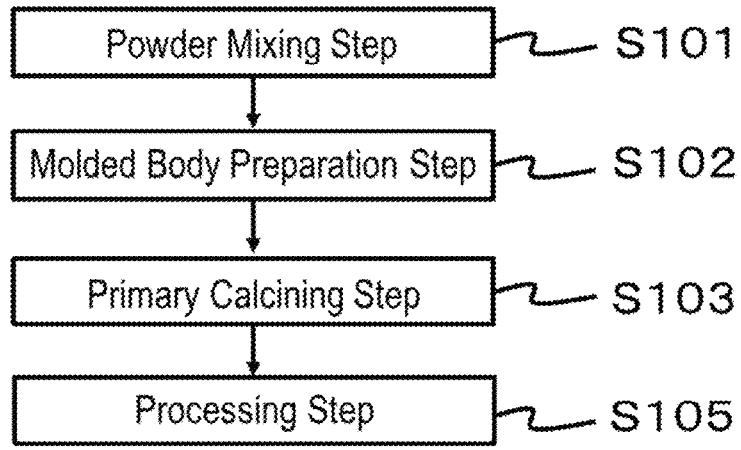
FIG. 1 is a flowchart describing a method for producing a wavelength conversion sintered body according to the present disclosure.

Embodiments of the method for producing a wavelength conversion sintered body according to the present disclosure will be hereunder described. The embodiments described below are exemplifications for embodying the technical idea of the present disclosure, and the present disclosure is not limited to the following method for producing a wavelength conversion sintered body. Standards according to JIS Z8110 are applied to the relations between color names and chromaticity coordinates, the relations between wavelength ranges of light and color names of monochromatic lights.

Method for Producing Wavelength Conversion Sintered Body

The method for producing a wavelength conversion sintered body includes: preparing a molded body comprising or composed of a mixture containing an α-SiAlON fluorescent material, aluminum oxide particles, and optionally a rare earth aluminate fluorescent material, and having a content of Ga of 15 ppm by mass or less; and primary calcining the molded body at a temperature in a range of 1,370° C. or more and 1,600° C. or less to obtain a first sintered body. The wavelength conversion sintered body comprising or composed of the first sintered body contains at least an α-SiAlON fluorescent material and aluminum oxide, and may further contain a rare earth aluminate fluorescent material in addition to these. Since the wavelength conversion sintered body comprising or composed of the first sintered body contains aluminum oxide that is a material having a relatively high thermal conductivity, the heat radiation can be improved as compared with a member containing, for example, a glass component.

A mixture containing an α-SiAlON fluorescent material, aluminum oxide particles, and optionally a rare earth aluminate fluorescent material is molded, and the molded body is sintered to obtain a sintered body. In this procedure, when a very small amount of gallium oxide ($Ga_2O_3$) is contained in the mixture, the gallium oxide inhibits sintering of the aluminum oxide particles, so that voids are formed in the sintered body, and the relative density of the first sintered body may be lowered. In the sintered body having a low relative density, the excitation light is scattered by the voids in the sintered body, or the incident excitation light is passed through the sintered body by the voids, so that the efficiency of wavelength conversion by the fluorescent material is lowered, and the light emission intensity may be lowered. Further, when the gallium oxide is contained in the mixture, Ga in the oxide reacts with the α-SiAlON fluorescent material, the body color of the α-SiAlON fluorescent material becomes dull, and the chromaticity of light emitted from the wavelength conversion sintered body may be changed. The reason why, when the gallium oxide is contained in the mixture, the sintering of the aluminum oxide particles is inhibited and the body color of the α-SiAlON fluorescent material is changed is not clarified. For example, the gallium oxide has a relatively low melting point of 1,700° C. to 1,900° C. It is presumed that, when the gallium oxide is contained in the mixture, the sintering of the aluminum oxide particles is inhibited by the gallium oxide having a relatively low melting point, and Ga in the oxide readily reacts with the α-SiAlON fluorescent material. In the case where the temperature at which the molded body is primary calcined is 1,370° C. or more, the gallium oxide having a low melting point is evaporated before reacting with the aluminum oxide particles, even when a trace amount of the gallium oxide is contained in the mixture. Therefore, the sintering inhibition of the aluminum oxide particles by the gallium oxide is suppressed, and the reaction between Ga in the gallium oxide and the α-SiAlON fluorescent material tends to be suppressed. In the case where the temperature at which the molded body is primary calcined is less than 1,370° C., the sintering of the aluminum oxide particles may be inhibited without evaporating the gallium oxide when a trace amount of the gallium oxide is contained. Then, a large number of voids are present in the resulting first sintered body, so that scattering of light becomes too large in the sintered body, and the light emission intensity tends to be lowered. In the present specification, the case where a trace amount of gallium oxide is contained means that the content of Ga (hereinafter also referred to as "Ga amount") in a mixture is 15 ppm by mass or less. The Ga amount in the mixture containing an α-SiAlON fluorescent material, aluminum oxide particles, and optionally a rare earth aluminate fluorescent material is more preferably 12 ppm by mass or less, even more preferably 10 ppm by mass or less, and may be 0.01 ppm by mass or more, or 0.1 ppm by mass or more.

When the content of Ga contained in the mixture constituting a molded body is 15 ppm by mass or less and the primary calcining temperature is 1,370° C. or more, the sintering inhibition of the aluminum oxide particles in the primary calcining hardly occurs. Thereby, the first sintered body has a high relative density, and is able to constitute a wavelength conversion sintered body capable of converting the wavelength of the excitation light into a desired chromaticity. The content of Ga contained in the mixture can be determined by analyzing elements contained in the mixture using an inductively coupled plasma atomic emission spectroscopy (ICP-AES), and measuring the content of Ga by the obtained elemental analysis results. Alternatively, the content of Ga contained in the mixture can be determined by measuring the Ga amount contained in each of the α-SiAlON fluorescent material, the aluminum oxide particles, and the rare earth aluminate fluorescent material to be raw materials by ICP-AES, and calculating the Ga amount contained in the mixture from the Ga amount contained in each of the raw materials and the blending ratio of the raw materials in the mixture.

The first sintered body is obtained by primary calcining a molded body formed by molding a mixture containing an α-SiAlON fluorescent material, aluminum oxide particles, and optionally a rare earth aluminate fluorescent material and having a content of Ga of 15 ppm by mass or less. Therefore, the α-SiAlON fluorescent material is sintered together with the aluminum oxide particles and the rare earth aluminate fluorescent material while maintaining the crystal structure of the α-SiAlON fluorescent material without being partially decomposed in the crystal structure, and without dulling the body color by reacting with Ga contained in the gallium oxide, so that a wavelength conversion sintered body that emits light having a desired light emission peak wavelength by the excitation light can be obtained.

When an oxynitride fluorescent material such as an α-SiAlON fluorescent material is calcined together with aluminum oxide particles, nitrogen contained in the composition of the oxynitride fluorescent material readily reacts with oxygen in the oxide. Therefore, it has been presumed that the crystal structure of the α-SiAlON fluorescent material is changed, and a sintered body containing a fluorescent material that emits light to a practical extent cannot be obtained. However, the aluminum oxide is relatively hard to undergo a composition change due to heat, the aluminum oxide is hardly decomposed to generate oxygen, and the α-SiAlON fluorescent material is hard to be adversely affected. Accordingly, the light emission of the α-SiAlON fluorescent material is hardly adversely affected even when the sintered body is formed using the aluminum oxide particles. Furthermore, since the content of Ga in the mixture is 15 ppm by mass or less, the sintering of the aluminum oxide particles is not inhibited, and the wavelength of the excitation light is converted to a desired chromaticity, so that a wavelength conversion sintered body having a high light emission intensity can be obtained.

Aluminum contained in the aluminum oxide is a Group-13 element that is the same as gallium, and a trace amount of gallium may be contained in the aluminum oxide, for example, as an oxide or a composite oxide. Further, the rare earth aluminate fluorescent material may contain Ga depending on the composition or producing method. Even when the aluminum oxide and optionally the rare earth aluminate fluorescent material are contained in the mixture constituting a molded body, the first sintered body containing the α-SiAlON fluorescent material, the aluminum oxide particles, and the rare earth aluminate fluorescent material can be obtained without dulling the body color of the α-SiAlON fluorescent material and without inhibiting the sintering of the aluminum oxide particles, as long as the content of Ga in the mixture is 15 ppm by mass or less.

α-SiAlON Fluorescent Material

The α-SiAlON fluorescent material preferably has a composition represented by the following formula (I):

$$M_k Si_{12-(m+n)} Al_{m+n} O_n N_{16-n} : Eu \quad (I)$$

wherein M represents at least one element selected from the group consisting of Li, Mg, Ca, Sr, Y, and lanthanoid elements (excluding La and Ce), and k, m, and n satisfy 0<k≤2.0, 2.0≤m≤6.0, and 0≤n≤1.0, respectively.

The α-SiAlON fluorescent material may have a composition represented by the following formula (II):

$$Ca_v(Si,Al)_{12}(O,N)_{16} : Eu \quad (II)$$

wherein v satisfies 0<v≤2.

Here, in the present specification, in the formulae representing the compositions of the fluorescent materials, the part before the colon (:) represents elements and the molar ratio constituting a host crystal, and the part after the colon (:) represents an activating element. Further, plural elements sectioned by the comma (,) mean that the composition contains at least one element among these plural elements. The plural elements sectioned by the comma (,) in the compositional formulae mean that the composition contains at least one element selected from the plural elements thus sectioned by the comma, and may contain two or more kinds of the plural elements in combination.

The α-SiAlON fluorescent material used as a raw material for the first sintered body is preferably in the form of powder. The α-SiAlON fluorescent material contains aluminum (Al), which is a Group-13 element and is in the same group as Ga, in the composition, and the body color of the α-SiAlON fluorescent material tends to be dull by reacting with a trace amount of Ga in gallium oxide as described above. Therefore, the α-SiAlON fluorescent material rarely contains Ga, and even when Ga is contained as an oxide or the like, the Ga amount measured by, for example, ICP-AES is less than 20 ppm by mass, which is less than the detection limit. The α-SiAlON fluorescent material preferably has a volume median diameter, as measured according to a laser diffraction particle size distribution measuring method, in a range of 2 μm or more and 30 μm or less, more preferably in a range of 3 μm or more and 25 μm or less, even more preferably in a range of 4 μm or more and 20 μm or less, still more preferably in a range of 5 μm or more and 15 μm or less. When the volume median diameter of the α-SiAlON fluorescent material is 2 μm or more, the α-SiAlON fluorescent material can be dispersed substantially uniformly in the mixture, and the α-SiAlON fluorescent material can be also dispersed substantially uniformly in the molded body. When the volume median diameter of the α-SiAlON fluorescent material is 30 μm or less, the number of voids in the wavelength conversion sintered body can be reduced to increase the light emission intensity. In the present specification, the volume median diameter of the α-SiAlON fluorescent material means a particle diameter (volume median diameter) where the volume cumulative frequency reaches 50% from the small diameter side in the volume-based particle size distribution measured by the laser diffraction particle size distribution measuring method. In the laser diffraction particle size distribution measuring method, the measurement may be performed, for example, by using a laser diffraction particle size distribution measuring apparatus (product name: Mastersizer 3000, manufactured by Malvern Panalytical Ltd.).

The content of the α-SiAlON fluorescent material is preferably in a range of 0.1% by mass or more and 40% by mass or less, more preferably in a range of 0.5% by mass or more and 38% by mass or less, even more preferably in a range of 0.8% by mass or more and 35% by mass or less, still more preferably in a range of 1% by mass or more and 30% by mass or less, relative to 100% by mass of the mixture constituting a molded body in terms of charged-in mass ratio. When the content of the α-SiAlON fluorescent material falls within a range of 0.1% by mass or more and 40% by mass or less relative to 100% by mass of the mixture constituting a molded body, a wavelength conversion sintered body having a high light emission intensity can be obtained. When the content of the α-SiAlON fluorescent material in the mixture constituting a molded body is less than 0.1% by mass, a wavelength conversion sintered body having a desired light emission intensity may not be obtained. When the content of the α-SiAlON fluorescent material in the mixture constituting a molded body is more than 40% by mass, the content of the aluminum oxide particles becomes relatively small, and the density of the resulting wavelength conversion sintered body is lowered, so that the mechanical strength thereof may be lowered. Further, when the content of the α-SiAlON fluorescent material is more than 40% by mass, the thickness of the wavelength conversion sintered body may be necessarily made thin for obtaining, for example, a desired color tone and light emission intensity, thereby failing to obtain a desired strength of the wavelength conversion sintered body, which makes the handling difficult in some cases.

Aluminum Oxide Particles

The aluminum oxide particles used as a raw material for the first sintered body preferably has a purity of aluminum oxide of 99.0% by mass or more, more preferably 99.5% by mass or more. The first sintered body or the second sintered body obtained by calcining the molded body comprising or composed of the mixture containing the aluminum oxide particles having a purity of aluminum oxide of 99.0% by mass or more has a high translucency, and thus a wavelength conversion sintered body having a high light emission intensity can be obtained. The higher the purity of the aluminum oxide particles is, the smaller the content of Ga such as gallium oxide becomes. Thereby, the Ga amount contained in the mixture containing the α-SiAlON fluorescent material, the aluminum oxide particles, and optionally the rare earth aluminate fluorescent material can be reduced. In the case where commercially available aluminum oxide particles are used, the value of the purity of aluminum oxide described in the brochure can be referred to for the purity of aluminum oxide. In the case where the purity of aluminum oxide is unknown, the purity of the aluminum oxide particles can be determined by measuring the mass of the aluminum oxide particles, calcining the aluminum oxide particles at 800° C. for 1 hour in the air atmosphere to remove organic components attached to the aluminum oxide particles and moisture absorbed by the aluminum oxide particles, measuring the mass of the calcined aluminum oxide particles, and dividing the mass of the calcined aluminum oxide particles by the mass of the uncalcined aluminum oxide particles. The purity of the aluminum oxide particles can be calculated, for example, using the following calculation formula (1):

Purity (% by mass) of aluminum oxide particles= (Mass of aluminum oxide particles after calcining÷Mass of aluminum oxide particles before calcining)×100       (1)

The aluminum oxide particles preferably have an average particle diameter in a range of 0.1 μm or more and 1.3 μm or less, more preferably in a range of 0.2 μm or more and 1.0 μm or less, even more preferably in a range of 0.3 μm or more and 0.8 μm or less, still more preferably in a range of 0.3 μm or more and 0.6 μm or less. When the average particle diameter of the aluminum oxide particles falls within a range of 0.1 μm or more and 1.3 μm or less, the powder of the α-SiAlON fluorescent material, the aluminum oxide particles, and optionally a rare earth aluminate fluorescent material can be uniformly mixed, and a wavelength conversion sintered body comprising or composed of a sintered body having a high density with less voids can be produced. In the present specification, the average particle diameter of the aluminum oxide particles means an average particle diameter (Fisher Sub-Sieve Sizer's number) that is measured by a Fisher Sub-Sieve Sizer method (hereinafter also referred to as "FSSS method"). The FSSS method is a type of an air permeability method, and is a method for measuring a specific surface area by utilizing air flow resistance to determine a particle diameter.

The content of the aluminum oxide particles, excluding substances contained in a range of 100 ppm by mass (0.01% by mass) or less, may be the balance obtained by subtracting the content of the α-SiAlON fluorescent material in the mixture from 100% by mass of the mixture constituting a molded body, and is preferably in a range of 60% by mass or more and 99.9% by mass or less, more preferably in a range of 62% by mass or more and 99.5% by mass or less, even more preferably in a range of 65% by mass or more and 99.2% by mass or less, still more preferably in a range of 70% by mass or more and 99.0% by mass or less in terms of charged-in mass ratio. Where the mixture contains a rare earth aluminate fluorescent material, the content of the aluminum oxide particles, excluding substances contained in a range of 100 ppm by mass (0.01% by mass) or less, may be the balance obtained by subtracting the contents of the α-SiAlON fluorescent material and the rare earth aluminate fluorescent material in the mixture from 100% by mass of the mixture constituting a molded body, and is preferably in a range of 30% by mass or more and 99.9% by mass or less, more preferably in a range of 35% by mass or more and 99.5% by mass or less, even more preferably in a range of 40% by mass or more and 99.2% by mass or less, still more preferably in a range of 50% by mass or more and 98% by mass or less in terms of charged-in mass ratio.

The kind of the aluminum oxide constituting the aluminum oxide particles is not particularly limited. Examples of the crystal form of the aluminum oxide may include α, γ, δ, and θ, and any crystal form of the aluminum oxide may be used. As the aluminum oxide, α-alumina is preferably used since it is easily available, the α-SiAlON fluorescent material and the aluminum oxide particles can be easily mixed, and the molded body can be easily formed.

Rare Earth Aluminate Fluorescent Material

The mixture constituting a molded body may contain a rare earth aluminate fluorescent material. As the rare earth aluminate fluorescent material, a fluorescent material having an yttrium-aluminum-garnet-based crystal structure (hereinafter also referred to as "YAG fluorescent material"), or a fluorescent material having a lutetium-aluminum-garnet-based crystal structure (hereinafter also referred to as "LAG fluorescent material") in which yttrium is replaced with lutetium, can be used. As the YAG fluorescent material, for example, a fluorescent material having a composition represented by $(Y,Gd,Tb,Lu)_3Al_5O_{12}$:Ce.

The YAG fluorescent material preferably has a composition represented by the following formula (III):

$$(Y_{1-a-b}Gd_aCe_b)_3Al_5O_{12} \quad (III)$$

wherein a and b satisfy $0 \leq a \leq 0.500$ and $0 < b \leq 0.030$, respectively.

The LAG fluorescent material preferably has a composition represented by the following formula (IV):

$$(Lu_{1-c}Ce_c)_3Al_5O_{12} \quad (IV)$$

wherein c satisfies $0 < c \leq 0.100$.

The rare earth aluminate fluorescent material used as a raw material for the first sintered body is preferably in the form of powder. The rare earth aluminate fluorescent material preferably does not contain Ga. Even when the rare earth aluminate fluorescent material contains Ga, the Ga amount in the mixture containing the rare earth aluminate fluorescent material, which is measured by, for example, ICP-AES, is preferably less than 20 ppm by mass, which is below the detection limit. In order to reduce the Ga amount contained in the rare earth aluminate fluorescent material, a rare earth aluminate fluorescent material having a Ga amount of less than 20 ppm by mass is preferably produced by using a raw material having a small Ga amount. In the case where a commercially available rare earth aluminate fluorescent material is used, it is preferable to use a rare earth aluminate fluorescent material having a Ga amount measured by, for example, ICP-AES or a Ga amount described in the brochure of less than 20 ppm by mass. The rare earth aluminate fluorescent material preferably has an average particle diameter in a range of 1 μm or more and 50 μm or less, more preferably in a range of 1 μm or more and 40 μm or less, even more preferably in a range of 2 μm or more and 30 μm or less, still more preferably in a range of 2 μm or more and 20 μm or less, particularly preferably in a range of 2 μm or more and 15 μm or less. When the average particle diameter of the rare earth aluminate fluorescent material is 1 μm or more, the rare earth aluminate fluorescent material can be dispersed substantially uniformly in the mixture, and the rare earth aluminate fluorescent material can be also dispersed substantially uniformly in the molded body. When the average particle diameter of the rare earth aluminate fluorescent material is 50 μm or less, the number of voids in the wavelength conversion sintered body can be reduced to increase the light emission intensity. In the present specification, the average particle diameter of the rare earth aluminate fluorescent material means an average particle diameter measured by the FSSS method.

The content of the α-SiAlON fluorescent material or the total content of the α-SiAlON fluorescent material and the rare earth aluminate fluorescent material is preferably in a range of 0.1% by mass or more and 70% by mass or less, more preferably in a range of 0.5% by mass or more and 65% by mass or less, even more preferably in a range of 0.8% by mass or more and 60% by mass or less, still more preferably in a range of 1% by mass or more and 55% by mass or less, particularly preferably in a range of 2% by mass or more and 50% by mass or less, relative to 100% by mass of the mixture constituting a molded body in terms of charged-in mass ratio. When the content of the α-SiAlON fluorescent material or the total content of the α-SiAlON fluorescent material and the rare earth aluminate fluorescent material falls within a range of 0.1% by mass or more and 70% by mass or less relative to 100% by mass of the mixture constituting a molded body, a wavelength conversion sintered body having a high light emission intensity can be obtained. When the content of the α-SiAlON fluorescent material or the total content of the α-SiAlON fluorescent material and the rare earth aluminate fluorescent material is less than 0.1% by mass relative to 100% by mass of the mixture constituting a molded body, a wavelength conversion sintered body having a desired light emission intensity may not be obtained. When the content of the α-SiAlON fluorescent material or the total content of the α-SiAlON fluorescent material and the rare earth aluminate fluorescent material is more than 70% by mass relative to 100% by mass of the mixture constituting a molded body, the content of the fluorescent material contained in the first sintered body becomes relatively large, and thus the thickness of the first sintered body may be necessarily made thin for obtaining a desired light emission intensity or a desired color tone. The first sintered body that is made thin for obtaining a desired color tone may fail to obtain a desired strength of the wavelength conversion sintered body, which makes the handling difficult in some cases. Further, when the content of the α-SiAlON fluorescent material or the total content of the α-SiAlON fluorescent material and the rare earth aluminate fluorescent material is more than 70% by mass relative to 100% by mass of the mixture constituting a molded body, the amount of the fluorescent material contained in the molded body becomes large, the amount of the aluminum oxide becomes relatively small, and it may be difficult to increase the relative density of the wavelength conversion sintered body comprising or composed of the resulting first sintered body or the second sintered body described below.

In the case where the rare earth aluminate fluorescent material is contained in the mixture, the blending ratio of the α-SiAlON fluorescent material and the rare earth aluminate fluorescent material in the mixture constituting a molded body may be any amount as long as a first sintered body capable of emitting light with a desired light emission intensity and color tone is obtained; and the content of the α-SiAlON fluorescent material may be in a range of 0.1% by mass or more and 40% by mass or less, and the total content of the α-SiAlON fluorescent material and the rare earth aluminate fluorescent material may be in a range of 0.1% by mass or more and 70% by mass or less, relative to 100% by mass of the mixture. When the total content of the α-SiAlON fluorescent material and the rare earth aluminate fluorescent material falls within a range of 0.1% by mass or more and 70% by mass or less, and the content of the α-SiAlON fluorescent material falls within a range of 0.1% by mass or more and 40% by mass or less, relative to 100% by mass of the mixture constituting a molded body, the mass ratio of the α-SiAlON fluorescent material to the rare earth aluminate fluorescent material (α-SiAlON fluorescent material:rare earth aluminate fluorescent material) is preferably in a range of 1:99 to 99:1, more preferably in a range of 2:98 to 98:2, even more preferably in a range of 3:97 to 95:5, still more preferably in a range of 4:96 to 90:10, in terms of charged-in mass ratio.

When the total content of the α-SiAlON fluorescent material and the rare earth aluminate fluorescent material falls within a range of 0.1% by mass or more and 70% by mass or less, and the content of the α-SiAlON fluorescent material falls within a range of 0.1% by mass or more and 40% by mass or less, relative to 100% by mass of the mixture constituting a molded body, the content of the rare earth aluminate fluorescent material is preferably in a range of 0.1% by mass or more and 69.9% by mass or less, more preferably in a range of 0.5% by mass or more and 60% by mass or less, even more preferably in a range of 0.8% by mass or more and 50% by mass or less, still more preferably in a range of 1% by mass or more and 40% by mass or less, particularly preferably in a range of 1% by mass or more and 30% by mass or less, in terms of charged-in mass ratio. When the content of the rare earth aluminate fluorescent material falls within a range of 0.1% by mass or more and 69.9% by mass or less relative to 100% by mass of the mixture constituting a molded body, a wavelength conversion sintered body capable of providing a desired color tone can be obtained.

FIG. 1 is a flowchart describing the method for producing a wavelength conversion sintered body. The steps in the method for producing a wavelength conversion sintered body will be described with reference to FIG. 1. The method for producing a wavelength conversion sintered body includes a molded body preparation step S102 and a primary calcining step S103. The method for producing a wavelength conversion sintered body may include a powder mixing step S101 prior to the molded body preparation step S102, and may include a processing step S105 of processing the wavelength conversion sintered body after the primary calcining step S103.

Powder Mixing Step

In the powder mixing step, an α-SiAlON fluorescent material powder, aluminum oxide particles, and optionally a rare earth aluminate fluorescent material powder are mixed as powders constituting a molded body. The powders can be mixed using a mortar with a pestle. The powders may also be mixed using a mixing medium, such as a ball mill. Further, in order to facilitate mixing of the powder and to facilitate molding of the mixed powder, a molding auxiliary may be used. Examples of the molding auxiliary may include water and ethanol. The molding auxiliary is preferably one that is readily volatilized in a subsequent calcining step. The molding auxiliary may not be used. In the case where the molding auxiliary is added, the amount of the molding auxiliary is preferably 10 parts by mass or less, more preferably 8 parts by mass or less, even more preferably 5 parts by mass or less, relative to 100 parts by mass of the mixture.

Molded Body Preparation Step

In the molded body preparation step, the mixture containing the α-SiAlON fluorescent material, the aluminum oxide particles, and optionally the rare earth aluminate fluorescent material is molded into a desired shape to obtain a molded body. As the molding method of the mixture, a known method such as a press molding method can be employed, and examples thereof may include a die press molding method and a cold isostatic pressing method (hereinafter also referred to as "CIP treatment") of which the term is defined by JIS Z2500:2000, No. 2109. In order to form the shape of the molded body, two kinds of molding methods may be employed, and the CIP treatment may be performed after the die press molding. In the CIP treatment, the molded body is preferably pressed using water as a medium.

The pressure at the time of die press molding is preferably in a range of 3 MPa or more and 50 MPa or less, more preferably in a range of 4 MPa or more and 20 MPa or less. When the pressure at the time of die press molding falls within a range of 3 MPa or more and 50 MPa or less, the molded body can be formed into a desired shape.

The pressure in the CIP treatment is preferably in a range of 50 MPa or more and 250 MPa or less, more preferably in a range of 100 MPa or more and 200 MPa or less. When the pressure in the CIP treatment falls within the aforementioned range, the density of the molded body can be increased, and a molded body having a substantially uniform density over the entire thereof can be obtained, thereby increasing the density of the sintered body obtained in the subsequent primary calcining step and secondary calcining step.

Primary Calcining Step

The primary calcining step is a step of primary calcining the molded body obtained by molding the mixture containing the α-SiAlON fluorescent material, the aluminum oxide particles, and optionally the rare earth aluminate fluorescent material at a temperature in a range of 1,370° C. or more and 1,600° C. or less to obtain a first sintered body. By the primary calcining step, the sintering density among the α-SiAlON fluorescent material, the aluminum oxide particles, and optionally the rare earth aluminate fluorescent material contained in the molded body is increased, the scattering of light due to voids is suppressed, and the translucency is increased to emit excitation light, so that a wavelength conversion sintered body that emits light having a desired light emission peak wavelength by the excitation light can be obtained.

The temperature of the primary calcining is in a range of 1,370° C. or more and 1,600° C. or less. When the temperature of the primary calcining is less than 1,370° C., and when a trace amount of gallium oxide is contained in the mixture, the gallium oxide inhibits sintering of the aluminum oxide particles to form voids in the sintered body, and the relative density of the first sintered body may be lowered. In the sintered body having a low relative density, light is excessively scattered by the voids in the sintered body, and the light hardly passes through the sintered body, so that the light emission intensity of the wavelength conversion sintered body may be lowered. When the temperature of the primary calcining is more than 1,600° C., the α-SiAlON fluorescent material and the aluminum oxide particles are reacted in the molded body to decompose the crystal structure of the α-SiAlON fluorescent material, and the resulting first sintered body does not emit light even under irradiation of the excitation light. The temperature of the primary calcining is preferably in a range of 1,380° C. or more and 1,590° C. or less, more preferably in a range of 1,400° C. or more and 1,580° C. or less, even more preferably in a range of 1,400° C. or more and 1,560° C. or less.

Examples of the method of the primary calcining may include an atmosphere sintering method in which calcining is performed under a non-oxidizing atmosphere without applying pressure or load, a pressurized atmosphere sintering method in which calcining is performed under pressure in a non-oxidizing atmosphere, a hot-press sintering method, and a spark plasma sintering (hereinafter also referred to as "SPS") method.

The primary calcining is preferably performed under an atmosphere containing nitrogen gas. The atmosphere containing nitrogen gas is an atmosphere containing at least 99% by volume or more of nitrogen gas. The content of nitrogen gas in the atmosphere containing nitrogen gas is preferably 99% by volume or more, more preferably 99.5% by volume or more. The atmosphere containing nitrogen gas may contain a trace amount of gas such as oxygen in addition to the nitrogen gas. The content of oxygen in the atmosphere containing nitrogen gas is preferably 1% by volume or less, more preferably 0.5% by volume or less, even more preferably 0.1% by volume or less, still more preferably 0.01% by volume or less, particularly preferably 0.001% by volume or less. When the atmosphere of the primary calcining is the atmosphere containing nitrogen gas, the deterioration of the crystal structure of the α-SiAlON fluorescent material in the primary calcining is suppressed, and a first sintered body containing an α-SiAlON fluorescent material maintaining the crystal structure can be obtained.

The atmosphere pressure of the primary calcining is preferably in a range of 0.2 MPa or more and 200 MPa or less. The atmosphere pressure means gauge pressure. The primary calcining is preferably performed under an atmosphere pressure in a range of 0.2 MPa or more and 200 MPa or less. The higher the temperature is, the easier the decomposition of the α-SiAlON fluorescent material serving as an oxynitride becomes, and by performing the primary calcining under a pressurized atmosphere in a range of 0.2 MPa or more and 200 MPa or less, the decomposition of the α-SiAlON fluorescent material can be further suppressed to obtain a first sintered body having a high light emission intensity. The atmosphere pressure is more preferably in a range of 0.2 MPa or more and 1.0 MPa or less, even more preferably in a range of 0.8 MPa or more and 1.0 MPa or less in terms of gauge pressure.

Secondary Calcining Step

Figure 2:
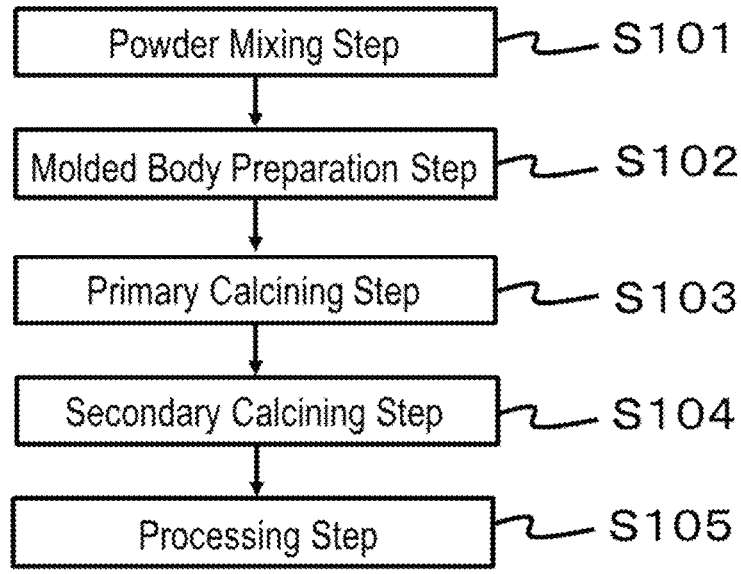
FIG. 2 is a flowchart describing a method for producing a wavelength conversion sintered body according to the present disclosure.

The method for producing a wavelength conversion sintered body preferably includes a step (secondary calcining step S104) of secondary calcining the first sintered body obtained after the primary calcining to obtain a second sintered body. FIG. 2 is a flowchart describing the method for producing a wavelength conversion sintered body.

The secondary calcining is preferably performed at a temperature in a range of 1,000° C. or more and 1,600° C. or less according to a hot isostatic pressing (hereinafter also referred to as "HIP") treatment of which the term is defined by JIS Z2500:2000, No. 2112. When the temperature of the secondary calcining is less than 1,000° C., a second sintered body having a relative density higher than that of the first sintered body cannot be obtained even by performing the secondary calcining. When the temperature of the secondary calcining is more than 1,600° C., the α-SiAlON fluorescent material and the aluminum oxide particles are reacted to decompose a part of the crystal structure of the α-SiAlON fluorescent material, and the light emission intensity of the resulting second sintered body may be lowered. The temperature of the secondary calcining is more preferably in a range of 1,100° C. or more and 1,580° C. or less, even more preferably in a range of 1,200° C. or more and 1,570° C. or less, still more preferably in a range of 1,300° C. or more and 1,560° C. or less, particularly preferably in a range of more than 1,350° C. and 1,550° C. or less.

The secondary calcining is preferably performed under an inert gas atmosphere. The inert gas atmosphere means an atmosphere mainly containing argon, helium, nitrogen, and the like. Here, the expression "mainly containing argon, helium, nitrogen, and the like" means that the atmosphere contains at least one gas selected from the group consisting of argon, helium, and nitrogen in an amount of 50% by volume or more. The content of oxygen in the inert gas atmosphere is preferably 1% by volume or less, more preferably 0.5% by volume or less, even more preferably 0.1% by volume or less, still more preferably 0.01% by volume or less, particularly preferably 0.001% by volume or less. The inert gas atmosphere may be the same atmosphere as the atmosphere containing nitrogen gas in the primary calcining, and the content of nitrogen gas in the atmosphere containing nitrogen gas is preferably 99% by volume or more, more preferably 99.5% by volume or more. When the atmosphere of the secondary calcining is the inert gas atmosphere, the deterioration of the crystal structure of the α-SiAlON fluorescent material in the secondary calcining is suppressed, and a second sintered body containing an α-SiAlON fluorescent material maintaining the crystal structure can be obtained.

When the secondary calcining is performed according to the HIP treatment, the pressure in the HIP treatment is preferably in a range of 50 MPa or more and 300 MPa or less, more preferably in a range of 80 MPa or more and 200 MPa or less. When the pressure in the HIP treatment falls within a range of 50 MPa or more and 300 MPa or less, the entire sintered body can be made uniform and has a higher density without deteriorating the crystal structure of the α-SiAlON fluorescent material.

When the secondary calcining is performed according to the HIP treatment, the time period for the HIP treatment is, for example, in a range of 0.5 hour or more and 20 hours or less, and preferably in a range of 1 hour or more and 10 hours or less.

In the secondary calcining step, a second sintered body having further increased density can be obtained by further secondary calcining the first sintered body. The second sintered body may have a density lower than that of the first sintered body. Depending on the temperature of the secondary calcining and the content of the α-SiAlON fluorescent material in the first sintered body, there are cases where the first sintered body has a density higher than that of the second sintered body, since closed pores contained in the first sintered body are collapsed by the secondary calcining, and simultaneously the α-SiAlON fluorescent material contained in the first sintered body is partially decomposed and evaporated to generate open pores in the second sintered body. When the density of the first sintered body is higher than that of the second sintered body, it is not necessary to perform the secondary calcining. It is presumed that, even when Ga is contained in the mixture constituting a molded body in an amount of 15 ppm by mass or less, a trace amount of Ga is substantially evaporated by the primary calcining. Thus, it can be considered that the sintered body is not affected by a trace amount of Ga contained in the mixture during the second calcining.

Processing Step

The method for producing a wavelength conversion sintered body may include a processing step of processing a wavelength conversion sintered body comprising or composed of the resulting first sintered body or the second sintered body. The processing step is a step of cutting the resulting wavelength conversion sintered body into a desired thickness and size. The method for cutting the wavelength conversion sintered body can be selected from known methods such as blade dicing, laser dicing, and wire sawing. Among them, wire sawing is preferred since the cut surface becomes flat with high accuracy. The thickness of the wavelength conversion sintered body is not particularly limited, and is preferably in a range of 1 μm or more and 1 mm or less, more preferably in a range of 10 μm or more and 800 μm or less, even more preferably in a range of 50 μm or more and 500 μm or less, still more preferably in a range of 100 μm or more and 400 μm or less, in consideration of the mechanical strength and the light emission intensity.

Relative Density of First Sintered Body

The relative density of the first sintered body is preferably 90% or more, more preferably 91% or more, even more preferably 93% or more, particularly preferably 94% or more. The relative density of the first sintered body may be 100%, and may be 99% or less, or 98% or less. When the relative density of the first sintered body is 90% or more, formation of voids caused by the sintering inhibition of the aluminum oxide particles due to a trace amount of Ga is suppressed, and the first sintered body can be used as a wavelength conversion sintered body having a desired light emission peak wavelength by irradiation with excitation light. In the case where the secondary calcining is performed after the primary calcining, when the relative density of the first sintered body is 90% or more, the density of the second sintered body can be further increased by the secondary calcining performed after the primary calcining, and the number of voids in the wavelength conversion sintered body can be reduced to suppress light scattering in the voids, thereby producing a wavelength conversion sintered body having a high light emission intensity.

The relative density of the first sintered body can be determined from the apparent density of the first sintered body and the true density of the first sintered body. The relative density can be determined by the following calculation formula (2):

Relative density (%) of first sintered body=(Apparent density of first sintered body÷True density of first sintered body)×100   (2)

The true density of the first sintered body is determined by the following calculation formula (3):

$$\text{True density of first sintered body} = \frac{P1_d \times P2_d \times A_d \times (P1_m + P2_m + A_m)}{(P2_d \times A_d \times P1_m) + (P1_d \times A_d \times P2_m) + (P1_d \times P2_d \times A_m)} \quad (3)$$

The apparent density of the first sintered body is determined from the mass of the first sintered body and the volume of the first sintered body obtained by the Archimedes' method. The apparent density of the first sintered body can be determined by the following calculation formula (4):

Apparent density (g/cm$^3$) of first sintered body=Mass (g) of first sintered body÷Volume (cm$^3$) of first sintered body (Archimedes' method)   (4)

Relative Density of Second Sintered Body

The relative density of the second sintered body obtained after the second calcining is preferably 92% or more, more preferably 93% or more, even more preferably 94% or more, particularly preferably 95% or more. Thereby, the number of voids in the wavelength conversion sintered body can be reduced, and the light emission intensity can be increased. Further, by reducing the number of voids, a wavelength conversion sintered body comprising or composed of a processed second sintered body can be obtained without being chipped, for example, in a processing step. The relative density of the second sintered body may be 100%, and may be 99.9% or less, or 99.8% or less.

The relative density of the second sintered body can be determined by substituting the first sintered body in the calculation formulae (2) to (4) for obtaining the relative density of the first sintered body, with the second sintered body.

Wavelength Conversion Sintered Body

The resulting first sintered body or second sintered body can be used as a wavelength conversion sintered body. The wavelength conversion sintered body comprising or composed of the first sintered body or the second sintered body contains at least an α-SiAlON fluorescent material and an aluminum oxide, and may further contain a rare earth aluminate fluorescent material in addition to these. The wavelength conversion sintered body comprising or composed of the first sintered body or the second sintered body preferably has a content of the α-SiAlON fluorescent material in a range of 0.1% by mass or more and 40% by mass or less. When the content of the α-SiAlON fluorescent material in the wavelength conversion sintered body falls within a range of 0.1% by mass or more and 40% by mass or less, a desired light emission intensity can be obtained. The content of the α-SiAlON fluorescent material in the wavelength conversion sintered body can be measured by analyzing the elements constituting the α-SiAlON fluorescent material with ICP-AES, and determining the content of the α-SiAlON fluorescent material contained in the wavelength conversion sintered body from the results of the obtained elemental analysis. The α-SiAlON fluorescent material contained in the wavelength conversion sintered body preferably has a composition represented by the aforementioned formula (I) or (II).

In the case where the wavelength conversion sintered body contains a rare earth aluminate fluorescent material, the total content of the α-SiAlON fluorescent material and the rare earth aluminate fluorescent material is preferably in a range of 0.1% by mass or more and 70% by mass or less. When the content of the α-SiAlON fluorescent material in the wavelength conversion sintered body falls within a range of 0.1% by mass or more and 40% by mass or less, and when the total content of the α-SiAlON fluorescent material and the rare earth aluminate fluorescent material falls within a range of 0.1% by mass or more and 70% by mass or less, light emission with a desired color tone can be obtained by irradiation with excitation light. The rare earth aluminate fluorescent material in the wavelength conversion sintered body is subjected to elemental analysis by ICP-AES, and the content of the rare earth aluminate fluorescent material contained in the wavelength conversion sintered body can be measured from the results of the obtained elemental analysis. The rare earth aluminate fluorescent material preferably has a composition represented by $(Y,Gd,Tb,Lu)_3Al_5O_{12}$:Ce, and preferably has a composition represented by the aforementioned formula (III) or (IV).

The α-SiAlON fluorescent material, the aluminum oxide, and optionally the rare earth aluminate fluorescent material contained in the wavelength conversion sintered body are distinguished by the grain boundaries since they have different crystal structures. The wavelength conversion sintered body comprises or is composed of the first sintered body or the second sintered body, and the relative density thereof is preferably 90% or more, more preferably 91% or more, even more preferably 92% or more, still more preferably 94% or more, particularly preferably 95% or more. The relative density of the wavelength conversion sintered body can be determined by substituting the first sintered body in each of the calculation formulae (2) to (4) with the wavelength conversion sintered body.

The wavelength conversion sintered body can constitute a light emitting device by being combined with a light emitting element such as an LED or an LD. The wavelength conversion sintered body converts excitation light emitted from the light emitting element and emits light having a desired light emission peak wavelength, and the light emitting device emits mixed color light of the light emitted from the light emitting element and the light of which the wavelength is converted by the wavelength conversion sintered body. As the light emitting element, for example, a light emitting element that emits light in a wavelength range of 350 nm or more and 500 nm or less can be used. As the light emitting element, for example, a semiconductor light emitting element using a nitride-based semiconductor ($In_XAl_YGa_{1-X-Y}N$, $0 \leq X$, $0 \leq Y$, $X+Y \leq 1$) can be used. By using a semiconductor light emitting element as the excitation light source, a stable light emitting device which is high in linearity of an output against an input with high efficiency and strong against mechanical impacts can be obtained.

As the light emitting element, an LD may be used. Excitation light emitted from the LD is incident on the wavelength conversion sintered body; the light obtained by converting the wavelength of the excitation light is converged and separated into red light, green light, and blue light by plural optical systems, such as a lens array, a deflection conversion element, and a color separation optical system; and the lights may be modulated according to image information to thereby form color image lights. The excitation light emitted from the LD as the light emitting element may be incident on the wavelength conversion sintered body through an optical system such as a dichroic mirror or a collimating optical system.

EXAMPLES

The present disclosure is hereunder specifically described by reference to the following Examples. The present disclosure is not limited to these Examples.

Production of LAG Fluorescent Material 1

Lutetium oxide ($Lu_2O_3$), cerium oxide ($CeO_2$), and aluminum oxide ($Al_2O_3$) were weighed and mixed so as to have a desired composition, thereby obtaining a raw material mixture. Barium fluoride ($BaF_2$) as a flux was added to the raw material mixture, and the raw material mixture and the flux were further mixed using a ball mill. The mixture was placed in an alumina crucible and heat-treated under a reducing atmosphere at 1,500° C. for 10 hours to obtain a calcined product. The calcined product was dispersed in pure water and passed through a wet-type sieve by flowing the solvent (pure water) while applying vibrations via the sieve. Subsequently, the resulting product was dehydrated and dried, and then passed through a dry-type sieve to undergo classification, thereby obtaining a lutetium-aluminum-garnet (hereinafter also referred to as "LAG") fluorescent material 1. The average particle diameter (Fisher Sub-Sieve Sizer's number) of the LAG fluorescent material 1 was measured by the FSSS method described below. The average particle diameter of the LAG fluorescent material 1 was 23 μm. The LAG fluorescent material 1 was subjected to composition analysis by the method described below. The LAG fluorescent material 1 had a composition represented by $Lu_{2.984}Ce_{0.016}Al_5O_{12}$. The Ga amount in the LAG fluorescent material 1 was less than 20 ppm by mass.

Production of LAG Fluorescent Material 2

An LAG fluorescent material 2 was produced in the same manner as the LAG fluorescent material 1. The average particle diameter of the LAG fluorescent material 2, as measured according to the FSSS method, was 23 μm. The LAG fluorescent material 2 had a composition represented by $Lu_{2.984}Ce_{0.016}Al_5O_{12}$. The Ga amount in the LAG fluorescent material 2 was 58 ppm by mass.

Production of YAG Fluorescent Material

Yttrium oxide ($Y_2O_3$), gadolinium oxide ($Gd_2O_3$), cerium oxide ($CeO_2$), and aluminum oxide ($Al_2O_3$) were weighed and mixed so as to have a desired composition, thereby obtaining a raw material mixture. Barium fluoride ($BaF_2$) as a flux was added to the raw material mixture, and the raw material mixture and the flux were further mixed using a ball mill. The mixture was placed in an alumina crucible and heat-treated under a reducing atmosphere at 1,500° C. for 10 hours to obtain a calcined product. The calcined product was dispersed in pure water and passed through a wet-type sieve by flowing the solvent (pure water) while applying vibrations via the sieve. Subsequently, the resulting product was dehydrated and dried, and then passed through a dry-type sieve to undergo classification, thereby obtaining an yttrium-aluminum-garnet (hereinafter also referred to as "YAG") fluorescent material. The average particle diameter of the YAG fluorescent material, as measured according to the FSSS method, was 5 μm. The YAG fluorescent material had a composition represented by $(Y_{0.575}Gd_{0.400}Ce_{0.025})_3Al_5O_{12}$. The Ga amount in the YAG fluorescent material was less than 20 ppm by mass.

Measurement of Average Particle Diameter by FSSS Method

As for each of the rare earth aluminate fluorescent materials (LAG fluorescent material 1, LAG fluorescent material 2, and YAG fluorescent material) and aluminum oxide particles used in Examples, the average particle diameter was measured according to the FSSS method, using a Fisher Sub-Sieve Sizer Model 95 (manufactured by Fisher Scientific Inc.).

Composition Analysis

As for each of the fluorescent materials to be measured, the mass percentage (% by mass) of each element excluding oxygen was measured with an inductively coupled plasma atomic emission spectrometer (ICP-AES), and the molar ratio of each element in the composition of the fluorescent material was calculated from the mass percentage of each element. As for each of the LAG fluorescent materials and the YAG fluorescent material, the molar ratio of each element other than Al was calculated based on the molar ratio of Al of 5. In addition, the Ga amount of each of the LAG fluorescent materials and the YAG fluorescent material was measured. The LAG fluorescent material 1 and the YAG fluorescent material had a Ga amount of less than 20 ppm by mass, which was below the detection limit.

The wavelength conversion sintered body (first sintered body or second sintered body) of each of Examples and Comparative Examples described below was measured as follows. The results are shown in Tables 1 to 4.

Volume Median Diameter by Laser Diffraction Particle Size Distribution Measuring Method As for the α-SiAlON fluorescent material used in each of Examples, the particle diameter (volume median diameter) at a cumulative frequency of 50% from the small diameter side in the volume-based particle size distribution was measured according to a laser diffraction particle size distribution measuring method, using a laser diffraction particle size distribution measuring apparatus (product name: Mastersizer 3000, manufactured by Malvern Panalytical Ltd.).

Measurement of Purity of Aluminum Oxide Particles

The purity of the aluminum oxide particles used in each of Examples and Comparative Examples was measured. After measuring the mass of the aluminum oxide particles used in each of Examples and Comparative Examples, the aluminum oxide particles were calcined in the air atmosphere at 800° C. for 1 hour so as to remove organic components attached to the aluminum oxide particles and moisture absorbed by the aluminum oxide particles, and the mass of the calcined aluminum oxide particles was measured. The purity of aluminum oxide in the aluminum oxide particles was determined from the masses of the aluminum oxide particles before and after the calcining according to the calculation formula (1).

Measurement of Relative Densities of First Sintered Body and Second Sintered Body The relative density of the first sintered body in each of Examples and Comparative Examples was determined based on the calculation formulae (2) to (4). In the calculation formula (3), the true density of the α-SiAlON fluorescent material was 3.29 g/cm$^3$, the true density of the aluminum oxide particles was 3.98 g/cm$^3$, the true density of each of the LAG fluorescent material 1 and the LAG fluorescent material 2 was 6.48 g/cm$^3$, and the true density of the YAG fluorescent material was 4.77 g/cm$^3$. The relative density of the second sintered body was determined based on the calculation formulae (2) to (4) by substituting the first sintered body with the second sintered body in the calculation formulae (2) to (4). The true density of the first sintered body or the second sintered body was determined by substituting the rare earth aluminate fluorescent material with the LAG fluorescent material 1, the LAG fluorescent material 2, or the YAG fluorescent material in the calculation formula (3).

Measurement of Relative Light Emission Intensity

The wavelength conversion sintered body composed of the first sintered body or the second sintered body in each of Examples and Comparative Examples was cut into a thickness of 500 μm using a wire saw to form a sample. The sample of the wavelength conversion sintered body was irradiated with light emitted from a nitride semiconductor LED chip with a light emission peak wavelength of 455 nm used as an excitation light source, and the light emission intensity at the light emission peak wavelength in a wavelength range of 430 nm or more and 800 nm or less obtained from the sample upon receiving the light from the light source was measured using a spectrofluorophotometer (manufactured by NICHIA CORPORATION). As for Examples 1 to 6 described below, the relative light emission intensity (%) was expressed when the light emission intensity at the light emission peak wavelength in a wavelength range of 430 nm or more and 800 nm or less obtained from the sample of the wavelength conversion sintered body in Example 1 was defined as 100%. As for Example 7 and Comparative Examples 1 and 2, the relative light emission intensity (%) was expressed when the light emission intensity at the light emission peak wavelength in a wavelength range of 430 nm or more and 800 nm or less obtained from the sample of the wavelength conversion sintered body in Example 7 was defined as 100%. As for Examples 8 to 13 and Comparative Examples 3 to 4 described below, the relative light emission intensity (%) was expressed when the light emission intensity at the light emission peak wavelength in a wavelength range of 430 nm or more and 800 nm or less obtained from the sample of the wavelength conversion sintered body in Example 10 was defined as 100%. As for Examples 14 to 19 described below, the relative light emission intensity (%) was expressed when the light emission intensity at the light emission peak wavelength in a wavelength range of 430 nm or more and 800 nm or less obtained from the sample of the wavelength conversion sintered body in Example 17 was defined as 100%.

Chromaticities x, y

As for the sample of the wavelength conversion sintered body in each of Examples and Comparative Examples, the chromaticity x and the chromaticity y on the xy color coordinates in the Commission International de l'eclarirage (CIE) 1931 color system were determined from the measured light emission spectrum data.

External Appearance Photograph

Figure 3:
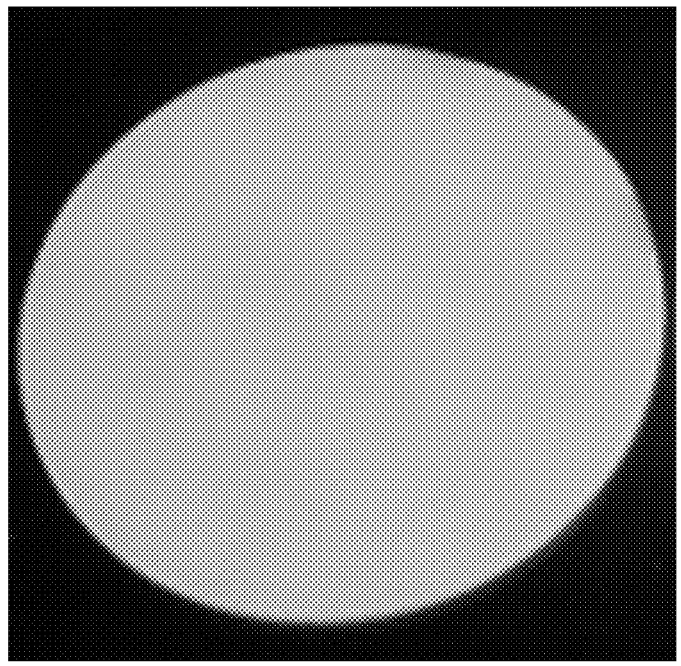
FIG. 3 is a photograph showing the external appearance of a wavelength conversion sintered body according to Example 7.
Figure 4:
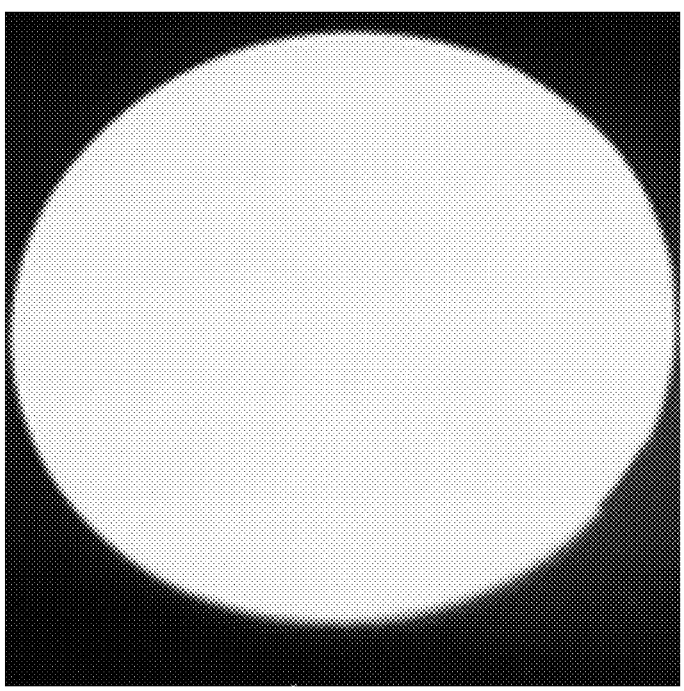
FIG. 4 is a photograph showing the external appearance of a wavelength conversion sintered body according to Comparative Example 1.
Figure 5:
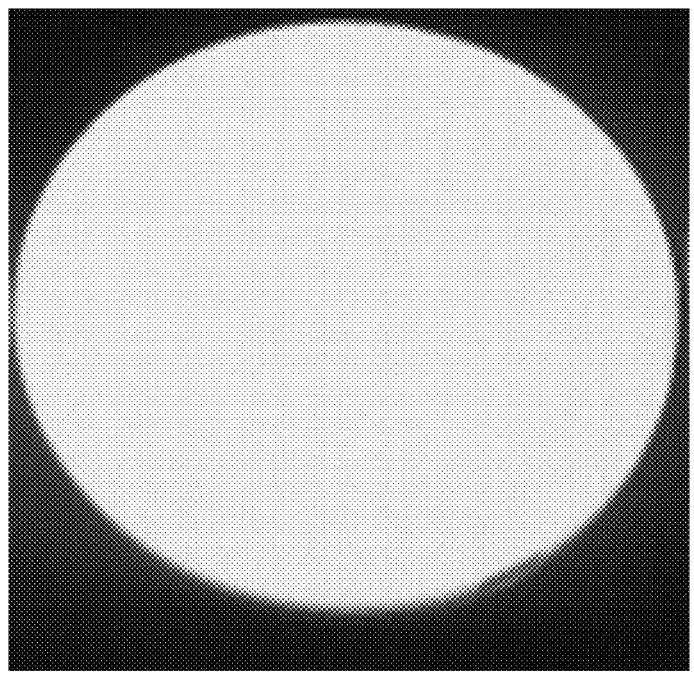
FIG. 5 is a photograph showing the external appearance of a wavelength conversion sintered body according to Comparative Example 2.

External appearance photographs of the wavelength conversion sintered bodies of Example 7, Comparative Examples 1 and 2 were obtained using a commercially available camera by placing a blackboard on the background. FIGS. 3 to 5 show the external appearance photographs of the samples of the wavelength conversion sintered bodies according to Example 7, Comparative Examples 1 and 2, respectively.

Example 1

Powder Mixing Step

One part by mass of an α-SiAlON fluorescent material (product name: ALONBRIGHT, type: YL-600, manufactured by Denka Co., Ltd.) having a volume median diameter of 13.0 μm measured according to the laser diffraction particle size distribution measuring method (1% by mass of an α-SiAlON fluorescent material relative to 100% by mass of a mixture for forming a molded body) and 99 parts by mass of aluminum oxide (α-alumina) particles (product name: AA03, manufactured by Sumitomo Chemical Industry Co., Ltd., purity of aluminum oxide: 99.5% by mass)

having an average particle diameter of 0.5 µm measured according to the FSSS method (99% by mass of aluminum oxide particles relative to 100% by mass of a mixture for forming a molded body) were weighed and mixed using a mortar with a pestle, thereby preparing a mixture for forming a molded body. In Table 1, the content (% by mass) of the α-SiAlON fluorescent material shows the charged-in mass ratio relative to 100% by mass of the mixture for forming a molded body. The content of the aluminum oxide particles, excluding substances contained in a range of 100 ppm by mass (0.01% by mass) or less, is the balance obtained by subtracting the content of the α-SiAlON fluorescent material in the mixture from 100% by mass of the mixture constituting a molded body. In Table 1, the content of the aluminum oxide particles in each of Examples shows the balance obtained by subtracting the content (% by mass) of the α-SiAlON fluorescent material from 100% by mass of the mixture for forming a molded body. The Ga content in the mixture (represented in Tables as "Ga Amount in Mixture") was calculated from the blending ratio of the α-SiAlON fluorescent material and the aluminum oxide particles contained in the mixture. The content of Ga contained in the α-SiAlON fluorescent material measured according to ICP-AES was less than 20 ppm by mass, which was less than the detection limit, and it was presumed that Ga was not contained since the body color of the α-SiAlON fluorescent material was not dull. Thus, the Ga amount in the mixture was calculated assuming that the content of Ga contained in the α-SiAlON fluorescent material was 0 ppm by mass. Also, the content of Ga contained in the aluminum oxide particles measured according to ICP-AES was less than 5 ppm by mass, which was below the detection limit, and thus the Ga amount in the mixture was calculated assuming that the content of Ga contained in the aluminum oxide particles was 0 ppm by mass. The ppm in each Table means ppm by mass.

Molded Body Preparation Step

The mixture for forming a molded body was filled in a die to form a cylindrical molded body having a diameter of 17.0 mm and a thickness of 10 mm at a pressure of 1.8 MPa (200 kgf/cm²). The resulting molded body was put in a packaging container, vacuum-packaged, and subjected to a CIP treatment by using water as a pressure medium at 176 MPa, using a cold hydro-isostatic pressing apparatus (manufactured by Kobe Steel, Ltd.).

Primary Calcining Step

The resulting molded body was primary calcined by retaining in a calcining furnace (manufactured by Fujidempa Kogyo Co., Ltd.) under a nitrogen-gas atmosphere (nitrogen: 99% by volume or more) at 0.9 MPa and a temperature of 1,500° C. for 6 hours, thereby obtaining a first sintered body. The content (% by mass) of each of the α-SiAlON fluorescent material and the aluminum oxide in the resulting first sintered body was substantially the same as the charged-in mass ratio of each of the α-SiAlON fluorescent material and the aluminum oxide particles relative to 100% by mass of the mixture for forming a molded body. The resulting first sintered body was designated as a wavelength conversion sintered body.

Examples 2 to 5

A first sintered body was obtained in the same manner as in Example 1 except that the blending ratio of the α-SiAlON fluorescent material and the aluminum oxide particles in the mixture was changed as shown in Table 1; and the resulting first sintered body was designated as a wavelength conversion sintered body.

Example 6

A first sintered body was obtained in the same manner as in Example 1 except that the temperature of the primary calcining was changed to 1,550° C. as shown in Table 1; and the resulting first sintered body was designated as a wavelength conversion sintered body.

TABLE 1

|  | α-SiAlON Fluorescent Material (% by mass) | Aluminum Oxide (% by mass) | Ga Amount in Mixture (ppm by mass) | Primary Calcining Temperature (° C.) | First Sintered Body | | | | | |
|---|---|---|---|---|---|---|---|---|---|---|
|  |  |  |  |  | No. | Mass (g) | True Density (g/cm³) | Apparent Density (g/cm³) | Relative Density (%) | Relative Light Emission Intensity (%) |
| Example 1 | 1 | 99 | 0 | 1500 | 1 | 4.95 | 3.97 | 3.67 | 92.4 | 100.0 |
| Example 2 | 3 | 97 | 0 | 1500 | 2 | 5.00 | 3.96 | 3.76 | 94.9 | 127.1 |
| Example 3 | 5 | 95 | 0 | 1500 | 3 | 4.96 | 3.94 | 3.75 | 95.0 | 138.4 |
| Example 4 | 10 | 90 | 0 | 1500 | 4 | 4.84 | 3.90 | 3.70 | 94.8 | 160.2 |
| Example 5 | 20 | 80 | 0 | 1500 | 5 | 4.71 | 3.82 | 3.53 | 92.3 | 143.6 |
| Example 6 | 5 | 95 | 0 | 1550 | 6 | 4.85 | 3.94 | 3.75 | 95.0 | 166.4 |

As shown in Table 1, the wavelength conversion sintered body in each of Examples 1 to 6 had a high relative density as 90% or more since the first sintered body was formed using the α-SiAlON fluorescent material and the aluminum oxide particles each containing no Ga (Ga amount was 0 ppm by mass). Further, the relative light emission intensity of the wavelength conversion sintered body in each of Examples 2 to 6 was higher than that of Example 1.

Example 7

Powder Mixing Step

A first sintered body was obtained through the molded body preparation step and the primary calcining step in the same manner as in Example 1 except that 15 parts by mass of an LAG fluorescent material 1 having an average particle diameter of 23 µm measured according to the FSSS method and having a Ga content of less than 20 ppm by mass (15% by mass of an LAG fluorescent material 1 relative to 100% by mass of the mixture for forming a molded body), 3 parts by mass of an α-SiAlON fluorescent material (product name: ALONBRIGHT, type: YL-600, manufactured by Denka Co., Ltd.) having a volume median diameter of 13.0 µm measured according to the laser diffraction particle size distribution measuring method (3% by mass of an α-SiAlON fluorescent material relative to 100% by mass of a mixture for forming a molded body), and 82 parts by mass of aluminum oxide (α-alumina) particles (product name: AA03, manufactured by Sumitomo Chemical Industry Co., Ltd., purity of aluminum oxide: 99.5% by mass) having an average particle diameter of 0.5 μm measured according to the FSSS method (82% by mass of aluminum oxide particles relative to 100% by mass of a mixture for forming a molded body) were used, and the temperature of the primary calcining was set to the temperature shown in Table 2. The content of the aluminum oxide particles, excluding substances contained in a range of 100 ppm by mass (0.01% by mass) or less, is the balance obtained by subtracting the contents of the α-SiAlON fluorescent material and the LAG fluorescent material in the mixture from 100% by mass of the mixture constituting a molded body. The Ga content in the mixture (represented in Tables as "Ga Amount in Mixture") was calculated from the blending ratio of the α-SiAlON fluorescent material, LAG fluorescent material 1, and the aluminum oxide particles contained in the mixture. The content of Ga contained in the α-SiAlON fluorescent material measured according to ICP-AES was 0 ppm by mass. The content of Ga contained in the aluminum oxide particles measured according to ICP-AES was less than 5 ppm by mass, which was below the detection limit. In the same manner as in Example 1, the Ga amount in the mixture was calculated assuming that the content of Ga contained in each of the α-SiAlON fluorescent material and the aluminum oxide particles was 0 ppm by mass. The Ga amount contained in the LAG fluorescent material 1 was less than 20 ppm by mass. The Ga amount in the mixture containing 15% by mass of the LAG fluorescent material 1 was calculated to be less than 3 ppm by mass.

Secondary Calcining Step

The resulting first sintered body was secondary calcined by applying a hot isostatic pressing (HIP) treatment by using a HIP apparatus (manufactured by Kobe Steel, Ltd.) under a nitrogen gas atmosphere (nitrogen: 99% by volume or more) using nitrogen gas as a pressure medium at a temperature of 1,450° C. and a pressure of 195 MPa for 2 hours, thereby obtaining a second sintered body. The second sintered body was designated as a wavelength conversion sintered body. The content (% by mass) of each of the α-SiAlON fluorescent material, the LAG fluorescent material 1, and the aluminum oxide in the resulting second sintered body was substantially the same as the charged-in mass ratio of each of the α-SiAlON fluorescent material, the LAG fluorescent material 1, and the aluminum oxide particles relative to 100% by mass of the mixture for forming a molded body.

Comparative Example 1

A second sintered body was obtained in the same manner as in Example 7 except that gallium oxide ($Ga_2O_3$) was added in the powder mixing step such that the content of Ga in the mixture was 50 ppm by mass; and the second sintered body was designated as a wavelength conversion sintered body.

Comparative Example 2

A second sintered body was obtained in the same manner as in Example 7 except that gallium oxide ($Ga_2O_3$) was added in the powder mixing step such that the content of Ga in the mixture was 200 ppm by mass; and the second sintered body was designated as a wavelength conversion sintered body.

TABLE 2

| | LAG Fluorescent Material (% by mass) | α-SiAlON Fluorescent Material (% by mass) | Aluminum Oxide (% by mass) | Ga Amount in Mixture (ppm by mass) | Primary Calcining Temperature (° C.) | First Sintered Body | | |
|---|---|---|---|---|---|---|---|---|
| | | | | | | Mass (g) | True Density (g/cm³) | Apparent Density (g/cm³) |
| Example 7 | 15 | 3 | 82 | less than 3 | 1435 | 4.80 | 4.21 | 4.09 |
| Comparative Example 1 | 15 | 3 | 82 | 50 | 1435 | 4.99 | 4.21 | 3.95 |
| Comparative Example 2 | 15 | 3 | 82 | 200 | 1435 | 4.96 | 4.21 | 3.98 |

| | First Sintered Body Relative Density (%) | Secondary Calcining Temperature (° C.) | Second Sintered Body | | Chromaticity | |
|---|---|---|---|---|---|---|
| | | | Relative Density (%) | Relative Light Emission Intensity (%) | x | y |
| Example 7 | 97.1 | 1450 | 99.9 | 100.0 | 0.424 | 0.423 |
| Comparative Example 1 | 93.9 | 1450 | 94.7 | 25.9 | 0.538 | 0.456 |
| Comparative Example 2 | 94.6 | 1450 | 95.6 | 35.0 | 0.525 | 0.466 |

As shown in Table 2, in the wavelength conversion sintered body according to Example 7, the relative density of the first sintered body was 95% or more, and the relative density of the second sintered body was 99.9%. In the wavelength conversion sintered bodies according to Comparative Examples 1 and 2, the relative light emission intensity was considerably lower than that of Example 7. The wavelength conversion sintered body in each of Comparative Examples 1 and 2 used the mixture containing more than 15 ppm by mass of Ga. Therefore, it is presumed that the α-SiAlON fluorescent material was reacted with Ga contained in the mixture to be changed into an α-SiAlON fluorescent material different from the original, the body color of the wavelength conversion sintered body was dull, and although the relative density was relatively high, the change of body color largely affected to the decrease of the light emission intensity of the wavelength conversion sintered body. In addition, the wavelength conversion sintered body in each of Comparative Examples 1 and 2 had different chromaticities x and y, particularly chromaticity x, as compared with those of Example 7, and was not able to provide a desired chromaticity.

FIG. 3 is a photograph showing the external appearance of the sample obtained by cutting the wavelength conversion sintered body according to Example 7 with a wire saw; FIG. 4 is a photograph showing the same of the wavelength conversion sintered body according to Comparative Example 1; and FIG. 5 is a photograph showing the same of the wavelength conversion sintered body according to Comparative Example 2. The external appearance of the wavelength conversion sintered body in each of Comparative Examples 1 and 2 was whitish as compared with that of Example 7, that is, the body color of the wavelength conversion sintered body in each of Comparative Examples 1 and 2 was changed.

Examples 8 to 10

A second sintered body was obtained in the same manner as in Example 7 except that the blending ratio of the LAG fluorescent material 1, α-SiAlON fluorescent material, and the aluminum oxide particles in the mixture was changed as shown in Table 3, the primary calcining was performed at 1,450° C., and the secondary calcining was performed at 1,400° C.; and the second sintered body was designated as a wavelength conversion sintered body.

Examples 11 to 13

A second sintered body was obtained in the same manner as in Example 7 except that an LAG fluorescent material 2 having an average particle diameter of 23 μm measured according to the FSSS method and having a Ga content of 58 ppm by mass was used, and the blending ratio of the LAG fluorescent material 2, the α-SiAlON fluorescent material, and the aluminum oxide particles in the mixture, the temperature of the primary calcining, and the temperature of the secondary calcining were changed as shown in Table 3; and the second sintered body was designated as a wavelength conversion sintered body.

Comparative Examples 3 and 4

A second sintered body was obtained in the same manner as in Example 7 except that an LAG fluorescent material 2 having an average particle diameter of 23 μm measured according to the FSSS method and having a Ga content of 58 ppm by mass was used, and the blending ratio of the LAG fluorescent material 2, the α-SiAlON fluorescent material, and the aluminum oxide particles in the mixture, the temperature of the primary calcining, and the temperature of the secondary calcining were changed as shown in Table 3; and the second sintered body was designated as a wavelength conversion sintered body.

TABLE 3

| | LAG Fluorescent Material (% by mass) | α-SiAlON Fluorescent Material (% by mass) | Aluminum Oxide (% by mass) | Ga Amount in Mixture (ppm by mass) | Primary Calcining Temperature (° C.) | First Sintered Body Mass (g) | True Density (g/cm$^3$) |
|---|---|---|---|---|---|---|---|
| Example 8 | 20 | 3 | 77 | less than 4 | 1450 | 4.93 | 4.28 |
| Example 9 | 15 | 3 | 82 | less than 3 | 1450 | 4.95 | 4.20 |
| Example 10 | 20 | 3 | 77 | 12 | 1450 | 4.93 | 4.28 |
| Example 11 | 10 | 3 | 87 | 6 | 1450 | 4.90 | 4.11 |
| Example 12 | 5 | 3 | 92 | 3 | 1450 | 4.91 | 4.03 |
| Example 13 | 5 | 3 | 92 | 3 | 1400 | 4.92 | 4.03 |
| Comparative Example 3 | 30 | 3 | 67 | 17 | 1400 | 5.07 | 4.47 |
| Comparative Example 4 | 10 | 3 | 87 | 6 | 1350 | 4.88 | 4.11 |

| | First Sintered Body Apparent Density (g/cm$^3$) | First Sintered Body Relative Density (%) | Secondary Calcining Temperature (° C.) | Second Sintered Body Relative Density (%) | Second Sintered Body Relative Light Emission Intensity (%) |
|---|---|---|---|---|---|
| Example 8 | 4.16 | 97.2 | 1400 | 99.7 | 208.3 |
| Example 9 | 4.10 | 97.8 | 1400 | 100.0 | 214.3 |
| Example 10 | 4.04 | 94.4 | 1400 | 94.7 | 100.0 |
| Example 11 | 3.95 | 96.1 | 1400 | 98.4 | 153.3 |
| Example 12 | 3.90 | 96.8 | 1400 | 99.6 | 193.3 |
| Example 13 | 3.80 | 94.3 | 1400 | 98.6 | 147.9 |
| Comparative Example 3 | 3.90 | 85.0 | 1400 | 85.0 | 31.6 |
| Comparative Example 4 | 3.64 | 88.4 | 1400 | 88.4 | 38.1 |

As shown in Table 3, in the wavelength conversion sintered bodies according to Examples 8 to 13, the relative density of the first sintered body was 94% or more, the relative density of the second sintered body was higher than that of the first sintered body, and a wavelength conversion sintered body having a high relative density was obtained. In the wavelength conversion sintered body according to Example 10, the relative density of the second sintered body was lower than those of Examples 8 to 9 and Examples 11 to 13. The wavelength conversion sintered body according to Example 10 had a Ga content of 12 ppm by mass in the mixture and had a higher Ga content than those of Examples 8 to 9 and Examples 11 to 13. Thus, it is presumed that the sintering of the aluminum oxide particles was inhibited by Ga, and a large number of voids were formed. In the wavelength conversion sintered body according to Example 13, the relative density of the first sintered body was lower than those of Examples 11 to 12. It is presumed that the relative density of the wavelength conversion sintered body according to Example 13 was lowered because the temperature of the primary calcining was lower than those of Examples 11 to 12, and the sintering of the aluminum oxide did not proceed as compared with Examples 11 and 12, so that the relative density of the first sintered body was low, and the relative density could not be increased even when the secondary calcining according to the HIP treatment was performed. It is presumed that, since the wavelength conversion sintered body according to Example 13 had a low relative density, the incident light was scattered, and the relative light emission intensity thereof was lower than those of Examples 11 and 12.

In the wavelength conversion sintered body according to Comparative Example 3, the content of Ga in the mixture was large as 17 ppm by mass, and the temperature of the primary calcining was lower than those of Examples 8 to 12. Thus, the sintering of the aluminum oxide was inhibited, and the relative density of the resulting second sintered body was low as less than 90% even when the secondary calcining was performed at the same secondary calcining temperature as in Examples 8 to 13. The wavelength conversion sintered body according to Comparative Example 4 had a primary calcining temperature of 1,350° C., which was lower than that of Comparative Example 3. Thus, the sintering of the aluminum oxide particles was inhibited by a trace amount of Ga, which was 6 ppm by mass, contained in the mixture, and a large number of voids were formed in the resulting first sintered body. Therefore, even when the secondary calcining according to the HIP treatment was performed, the relative density was not increased, and the first sintered body and the second sintered body had the same relative density. In the wavelength conversion sintered bodies according to Comparative Examples 3 and 4, since the relative density was low as less than 90%, the excitation light was scattered by the voids in the sintered body, or the incident excitation light was passed through the sintered body by the voids. Therefore, the efficiency of wavelength conversion was decreased by the fluorescent material, and the relative light emission intensity was considerably low as less than 50% as compared with the wavelength conversion sintered bodies according to Examples 8 to 13.

Examples 14 to 19

A first sintered body was obtained in the same manner as in Example 7 except that a YAG fluorescent material having an average particle diameter of 5 μm measured according to the FSSS method and having a Ga content of less than 20 ppm by mass was used instead of the LAG fluorescent material 1 or the LAG fluorescent material 2, and the blending ratio of the YAG fluorescent material, the α-SiAlON fluorescent material, and the aluminum oxide particles in the mixture, and the temperature of the primary calcining were changed as shown in Table 4; and the first sintered body was designated as a wavelength conversion sintered body. The content of the aluminum oxide particles, excluding substances contained in a range of 100 ppm by mass (0.01% by mass) or less, is the balance obtained by subtracting the contents of the α-SiAlON fluorescent material and the YAG fluorescent material in the mixture from 100% by mass of the mixture constituting a molded body.

TABLE 4

|  | YAG Fluorescent Material (% by mass) | α-SiAlON Fluorescent Material (% by mass) | Aluminum Oxide (% by mass) | Ga Amount in Mixture (ppm by mass) | Primary Calcining Temperature (° C.) | First Sintered Body Mass (g) |
|---|---|---|---|---|---|---|
| Example 14 | 10 | 3 | 87 | less than 2 | 1450 | 4.96 |
| Example 15 | 10 | 3 | 87 | less than 2 | 1500 | 4.89 |
| Example 16 | 5 | 10 | 85 | less than 1 | 1450 | 4.91 |
| Example 17 | 10 | 10 | 80 | less than 2 | 1450 | 4.96 |
| Example 18 | 20 | 10 | 70 | less than 4 | 1450 | 4.92 |
| Example 19 | 30 | 10 | 60 | less than 6 | 1450 | 4.88 |

|  | First Sintered Body | | | | | |
|---|---|---|---|---|---|---|
|  | True Density (g/cm³) | Apparent Density (g/cm³) | Relative Density (%) | Relative Light Emission Intensity (%) | Chromaticity x | Chromaticity y |
| Example 14 | 4.02 | 3.64 | 90.4 | 26.9 | 0.537 | 0.458 |
| Example 15 | 4.02 | 3.74 | 93.1 | 165.6 | 0.451 | 0.530 |

TABLE 4-continued

| | | | | | | |
|---|---|---|---|---|---|---|
| Example 16 | 3.93 | 3.64 | 92.7 | 171.8 | 0.559 | 0.439 |
| Example 17 | 3.96 | 3.63 | 91.6 | 100.0 | 0.555 | 0.443 |
| Example 18 | 4.03 | 3.71 | 92.0 | 128.8 | 0.546 | 0.451 |
| Example 19 | 4.10 | 3.73 | 91.1 | 100.6 | 0.547 | 0.450 |

As shown in Table 4, in the wavelength conversion sintered bodies according to Examples 14 to 19, the relative density of the first sintered body was 90% or more, and a wavelength conversion sintered body having a high relative density was obtained.

The wavelength conversion sintered body according to the present disclosure can be used as a wavelength conversion member capable of converting the wavelength of light emitted from an LED or an LD.

The invention claimed is:

1. A method for producing a wavelength conversion sintered body including:
preparing a molded body comprising a mixture comprising an α-SiAlON fluorescent material and aluminum oxide particles and having a content of Ga in a range of 0.01 ppm by mass or more and 15 ppm by mass or less; and
primary calcining the molded body at a temperature in a range of 1,370° C. or more and 1,590° C. or less to obtain a first sintered body.

2. The method for producing a wavelength conversion sintered body according to claim 1, wherein the content of Ga contained in the mixture is 10 ppm by mass or less.

3. The method for producing a wavelength conversion sintered body according to claim 1, wherein the mixture further comprises a rare earth aluminate fluorescent material.

4. The method for producing a wavelength conversion sintered body according to claim 3, further comprising secondary calcining the first sintered body by a hot isostatic pressing (HIP) treatment at a temperature in a range of 1,000° C. or more and 1,580° C. or less to obtain a second sintered body.

5. The method for producing a wavelength conversion sintered body according to claim 3, wherein the rare earth aluminate fluorescent material has an average particle diameter, as measured according to a Fisher Sub-Sieve Sizer method, in a range of 1 μm or more and 50 μm or less.

6. The method for producing a wavelength conversion sintered body according to claim 3, wherein the mixture comprises the α-SiAlON fluorescent material and the rare earth aluminate fluorescent material in a total amount of 0.1% by mass or more and 70% by mass or less relative to 100% by mass of the mixture; and the mixture comprises the aluminum oxide particles in a range of 30% by mass or more and 99.9% by mass or less relative to 100% by mass of the mixture.

7. The method for producing a wavelength conversion sintered body according to claim 6, wherein a remaining portion obtained by removing the α-SiAlON fluorescent material and the rare earth aluminate fluorescent material from 100% by mass of the mixture is composed of the aluminum oxide particles.

8. The method for producing a wavelength conversion sintered body according to claim 3, wherein the rare earth aluminate fluorescent material is at least one kind selected from the group consisting of a rare earth aluminate fluorescent material having a composition represented by the following formula (III) and a rare earth aluminate fluorescent material having a composition represented by the following formula (IV):

$$(Y_{1-a-b}Gd_aCe_b)_3Al_5O_{12} \quad (III)$$

wherein a and b satisfy 0≤a≤0.500 and 0<b≤0.030, respectively;

$$(Lu_{1-c}Ce_c)_3Al_5O_{12} \quad (IV)$$

wherein c satisfies 0<c≤0.100.

9. The method for producing a wavelength conversion sintered body according to claim 3, wherein the first sintered body has a relative density of 90% or more.

10. The method for producing a wavelength conversion sintered body according to claim 1, further comprising secondary calcining the first sintered body by a hot isostatic pressing (HIP) treatment at a temperature in a range of 1,000° C. or more and 1,580° C. or less to obtain a second sintered body.

11. The method for producing a wavelength conversion sintered body according to claim 1, wherein the α-SiAlON fluorescent material has a volume median diameter, as measured according to a laser diffraction particle size distribution measuring method, in a range of 2 μm or more and 30 μm or less.

12. The method for producing a wavelength conversion sintered body according to claim 1, wherein the aluminum oxide particles have an average particle diameter, as measured according to a Fisher Sub-Sieve Sizer method, in a range of 0.1 μm or more and 1.3 μm or less.

13. The method for producing a wavelength conversion sintered body according to claim 1, wherein the mixture comprises the α-SiAlON fluorescent material in an amount of 0.1% by mass or more and 40% by mass or less relative to 100% by mass of the mixture; and the mixture comprises the aluminum oxide particles in a range of 60% by mass or more and 99.9% by mass or less relative to 100% by mass of the mixture.

14. The method for producing a wavelength conversion sintered body according to claim 13, wherein a remaining portion obtained by removing the α-SiAlON fluorescent material from 100% by mass of the mixture is composed of the aluminum oxide particles.

15. The method for producing a wavelength conversion sintered body according to claim 1, wherein the α-SiAlON fluorescent material has a composition represented by the following formula (I):

$$M_kSi_{12-(m+n)}Al_{m+n}O_nN_{16-n}:Eu \quad (I)$$

wherein M represents at least one element selected from the group consisting of Li, Mg, Ca, Sr, Y, and lanthanoid elements (excluding La and Ce), and k, m, and n satisfy 0<k≤2.0, 2.0≤m≤6.0, and 0≤n≤1.0, respectively.

16. The method for producing a wavelength conversion sintered body according to claim 1, wherein the mixture is molded using press molding at a pressure of 3 MPa or more and 50 MPa or less to obtain the molded body.

17. The method for producing a wavelength conversion sintered body according to claim 1, wherein the mixture is subjected to a cold isostatic pressing treatment at a pressure of 50 MPa or more and 250 MPa or less to obtain the molded body.

18. The method for producing a wavelength conversion sintered body according to claim 1, wherein the aluminum oxide particles have a purity of aluminum oxide of 99.0% by mass or more.

19. The method for producing a wavelength conversion sintered body according to claim 1, wherein the first sintered body has a relative density of 90% or more.

20. The method for producing a wavelength conversion sintered body according to claim 1, wherein the molded body is composed of the mixture comprising the α-SiAlON fluorescent material and aluminum oxide particles.

* * * * *